(12) United States Patent
Fredrickson et al.

(10) Patent No.: US 7,430,699 B2
(45) Date of Patent: Sep. 30, 2008

(54) TRADING PROPENSITY-BASED CLUSTERING OF CIRCUIT ELEMENTS IN A CIRCUIT DESIGN

(75) Inventors: Mark S. Fredrickson, Rochester, MN (US); Chad B. McBride, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 375 days.

(21) Appl. No.: 11/348,907

(22) Filed: Feb. 7, 2006

(65) Prior Publication Data

US 2007/0260949 A1 Nov. 8, 2007

(51) Int. Cl.
*G01R 31/28* (2006.01)
(52) U.S. Cl. .......................... 714/731; 714/729; 716/10
(58) Field of Classification Search ...................... 716/6, 716/7, 10; 714/726, 727, 731, 729
See application file for complete search history.

(56) References Cited

U.S. PATENT DOCUMENTS

| 6,324,678 | B1 | 11/2001 | Dangelo et al. | |
|---|---|---|---|---|
| 6,442,743 | B1* | 8/2002 | Sarrafzadeh et al. | 716/10 |
| 6,857,110 | B1 | 2/2005 | Rupp et al. | |
| 6,961,916 | B2* | 11/2005 | Sarrafzadeh et al. | 716/10 |
| 7,162,706 | B2 | 1/2007 | Kuang et al. | |
| 2002/0162086 | A1 | 10/2002 | Morgan | |
| 2004/0225984 | A1 | 11/2004 | Tsao et al. | |
| 2004/0230931 | A1* | 11/2004 | Barbee et al. | 716/10 |
| 2004/0250226 | A1* | 12/2004 | Lin et al. | 716/7 |
| 2008/0104564 | A1* | 5/2008 | Lin et al. | 716/6 |

FOREIGN PATENT DOCUMENTS

WO WO0143166 6/2001

OTHER PUBLICATIONS

Kahng A. B., et al., "Practically Bounded-Skew Clock Routing", Journal of VLSI Signal Processing Systems for Signal, Image, and Video Technology, Jun. 1997, pp. 199-215, vol. 16, No. 2/3, Sprinter, New York, NY, USA.
Mike Wright, "Experiments with a Plateau-Rich Solution Space", MIC 2001, 4th Metaheuristics International Conference, Jul. 2001, pp. 317-320, Portugal.
Yip, K. "Clock Tree Distribution", IEEE Potentials, IEEE, Apr. 1997, pp. 11-14, vol. 16, No. 2, New York, NY, USA.
Bonhommey Y., et al., "Design of Routing-Constrained Low Power Scan Chains", Electronic Design, Test and Applications, Second IEEE International Workshop on Perth Australia, Jan. 2004, pp. 1-6, Piscataway, NJ, USA.
Liyang Lai, et al., "Logic BIST with Scan Chain Segmentation", 2004 International Conference on Charlotte, NC, Oct. 26, 2004, pp. 57-66, Piscataway, NJ, USA.

(Continued)

*Primary Examiner*—David Ton
(74) *Attorney, Agent, or Firm*—Wood, Herron & Evans (57) ABSTRACT

An apparatus, program product and method utilize a clustering algorithm based upon trading propensity to generate assignments of circuit elements to clusters or groups to optimize a spatial distribution of the plurality of clusters. For example, trading propensity-based clustering may be used to assign circuit elements such as scan-enabled latches to individual scan chains to optimize the layout of the scan chains in a scan architecture for an integrated circuit design.

16 Claims, 4 Drawing Sheets

OTHER PUBLICATIONS

Berthelot D., et al., "An Efficient Linear Time Algorithm for Scan Chain Optimization and Repartitioning", Proceedings International Test Conference 2002, pp. 781-787, Baltimore, MD, USA.

Dong-Sup Song et al., "Increasing Embedding Probabilities of RPRPs in RIN Based BIST", pp. 600-613, 2005, Springer Berlin Heidelberg.

* cited by examiner

TRADING PROPENSITY-BASED CLUSTERING OF CIRCUIT ELEMENTS IN A CIRCUIT DESIGN

CROSS-REFERENCE TO RELATED APPLICATIONS

This application is related to U.S. Ser. No. 11/348,970, entitled "HEURISTIC CLUSTERING OF CIRCUIT ELEMENTS IN A CIRCUIT DESIGN", and U.S. Ser. No. 11/348,877, entitled "AUTOMATIC BACK ANNOTATION OF A FUNCTIONAL DEFINITION OF AN INTEGRATED CIRCUIT DESIGN BASED UPON PHYSICAL LAYOUT", both filed on even date herewith, which applications are incorporated by reference herein.

FIELD OF THE INVENTION

The invention relates to computers and computer software, and in particular, to computer software used in integrated circuit device design.

BACKGROUND OF THE INVENTION

Integrated circuit devices, commonly known as chips, continue to become more powerful and complex as semiconductor manufacturing technologies have advanced. Whereas early integrated circuit devices included fewer than one hundred transistors, it is now common to integrate millions of transistors into a single integrated circuit device. This increased transistor count enables some operations that once required several integrated circuit devices to now be implemented in a single integrated circuit device, often providing greater performance at a lower cost. For example, where previously a data processing system might require separate integrated circuit devices for a microprocessor, a memory, a bus interface, and a memory controller, advances in chip density now permit all of these functions to be integrated into the same integrated circuit device. Such devices are typically known as "systems on a chip" due to the high level of integration they provide.

Increases in chip density have also significantly affected the design methodologies used for integrated circuit chips. Rather than manually laying out individual transistors or logic gates in a design to obtain a desired logic function, typically the functional aspects of the design process are separated from the physical aspects. The functional aspects of a design are typically addressed via a process known as a logic design, which results in the generation of a functional definition of a circuit design, typically defined in a hardware description language (HDL) such as VHDL or Verilog. An HDL representation of a circuit is analogous in many respects to a software program, as the HDL representation generally defines the logic or functions to be performed by a circuit design. Moreover, by separating logic design from physical layout, functions are capable of being defined at a higher level of abstraction.

In parallel with the creation of the HDL representation, a physical definition of a circuit design is created typically via a layout process, often referred to as integration, to essentially create a "floor plan" of logic gates and interconnects between the logic gates representing the actual physical arrangement of circuit elements on the manufactured integrated circuit. Automation tools have been developed to utilize predefined cells or blocks of complete circuits to assist with the layout, thus eliminating the need to work with millions of individual logic gates. For example, synthesis tools have been developed to generate Random Logic Macro (RLM) blocks from an HDL representation of a design, whereby an individual laying out a design is merely required to place the RLM blocks and connect them to one another to complete the circuit design. In addition, some designs incorporate blocks from off-the-shelf (OTS) logic blocks, which are reusable from design to design.

Once a physical definition is created, testing and simulation of the design may be performed to identify any potential timing and/or manufacturability issues, and once the design has been determined to meet these requirements, the design may be utilized to manufacture integrated circuits.

As integrated circuits have become more complex, the number of individuals involved in the development and testing processes has increased substantially. Indeed, in many instances the individuals performing the logic design process are completely separate from the integrators who perform the physical design processes. Furthermore, as integrated circuits have become more complex, larger and faster, timing issues become more pronounced, often necessitating the functional definition of a design to be revised after layout has been performed. In many instances, several iterations of reworking a functional definition, updating the physical definition, and retesting the physical definition may be required before timing issues are adequately resolved. With different individuals participating in these different processes, therefore, coordinating the updates to the functional and physical definitions can become problematic and time consuming.

One particular area, for example, where the layout process may require revision of a functional definition is associated with what is referred to herein as overhead logic, i.e., supplemental support circuitry that is not directly involved in the primary logic implemented by a circuit design. For example, in order to provide testability for a manufactured device, most integrated circuit designs include a scan architecture integrated therein with one or more serial chains of latches referred to as scan chains. The latches in a serial chain, or scan path, are designed such that, when configured in a specific mode, the latches together operate as a shift register so that data may be shifted into the chain of latches from a single source to simulate different conditions, and so that data generated within a device may be shifted out through a single output. Thus, with a scan architecture, the current state of various nodes in a device at any given time may be controlled and/or recorded and later accessed via external equipment to verify the operation of a manufactured device.

The latches in a scan chain are coupled together serially, typically with each latch having a scan in port and a scan out port, with the scan in port of each latch being connected to the scan out port of its preceding latch. Whereas less complex circuit designs might include tens or hundreds of latches in a single scan chain, more complex designs, e.g., many SOC designs, may require thousands of latches in a scan architecture. Furthermore, to ensure that the amount of time required to load and unload data into and out of a scan architecture, multiple scan chains are typically used, requiring each latch to be assigned to a specific scan chain, in addition to being assigned to a specific location in the selected scan chain.

Scan architectures may require additional clock control signals to be distributed to the various latches to enable and otherwise configure scan chain operation. With more complex integrated circuit designs, the size and timing constraints imposed on the designs often necessitate the use of distribution trees to distribute clock control signals and other overhead or non-overhead global signals. In a distribution tree, signals are distributed via a tree of latches that repower the signals, shorten effective wire lengths, and reduce fanout issues, while ensuring that the signals arrive at all endpoints at the same time. As a result, similar to the assignment of latches to scan chains, latches are often required to be connected to appropriate signals output from a distribution tree.

As a general design rule, it is desirable to utilize multiple balanced scan chains to reduce the length of each scan chain and thus reduce the amount of time required to test a circuit. Furthermore, it is often desirable to minimize the wire lengths used to connect the latches in a scan chain together, which is typically accomplished by grouping latches that are physically located in close proximity to one another into the same scan chain.

It is often desirable to maintain the assignments of latches to scan chains and distribution trees in a functional definition of a circuit design. With layout performed after logic design, however, the optimal assignment of latches to scan chains, as well as the assignment of latches to signal distribution trees, cannot be ascertained until after the design has been laid out. Often, a logic designer is required to initially connect latches to scan chains and distribution trees manually and based upon little more than educated guessing. Often, as a result of layout and testing, the latch connections must be modified manually to reduce wire lengths and achieve timing requirements. Given the iterative nature of the design process, repeated manual modifications may be required. This, in turn, makes it difficult to freeze the functional definition because the functional definition is dependent on layout changes and visa versa.

With large device integration, maintaining proper assignments becomes significantly problematic. For example, when a register (i.e., a group of latches) is physically moved any significant distance during integration, it often must be connected to a different node of a distribution tree and must be placed into a new position of a (possibly different) scan ring. A typical IP block may have dozens of registers (and as a result, hundreds of latches), each requiring separate distribution tree and scan chain assignments to be made. Some design sizes may yield on the order of 150 different distribution tree signals to choose from depending on the physical location of a register, and may incorporate 25 or more separate scan rings. As a result, the management of assignments can be a significant endeavor.

Increasing device frequencies typically drive more placement instabilities into a design, forcing integrators to make frequent changes to a device's floor plan. Since the connections to the scan architecture are not really a part of the functional logic, these changes are usually made without regard for the consequences on the scan architecture. Thus, the management of scan architecture connections, as well as those to other overhead circuitry in a circuit design, continues to increase in difficulty.

SUMMARY OF THE INVENTION

The invention addresses these and other problems associated with the prior art by providing an apparatus, program product and method that utilize a clustering algorithm based upon trading propensity to generate assignments of circuit elements to clusters or groups to optimize a spatial distribution of the clusters. For example, embodiments consistent with the invention may be used to assign circuit elements such as scan-enabled latches to individual scan chains to optimize the layout of the scan chains in a scan architecture for a circuit design.

Consistent with the invention, for example, circuit elements in a circuit design may be clustered by grouping a plurality of circuit elements in a circuit design into a plurality of size balanced clusters, and optimizing a spatial distribution of the plurality of clusters. The optimization may be performed by iteratively selecting first and second clusters, determining a trading propensity metric for each circuit element grouped into each of the first and second clusters, selecting a first selected circuit element from the first cluster and a second selected circuit element from the second cluster based upon the determined trading propensity metrics of at least a portion of the plurality of circuit elements, and trading the first and second selected circuit elements between the first and second clusters.

These and other advantages and features, which characterize the invention, are set forth in the claims annexed hereto and forming a further part hereof. However, for a better understanding of the invention, and of the advantages and objectives attained through its use, reference should be made to the Drawings, and to the accompanying descriptive matter, in which there is described exemplary embodiments of the invention.

DETAILED DESCRIPTION

The embodiments discussed hereinafter utilize a trading propensity-based clustering algorithm to generate assignments of circuit elements to clusters or groups to optimize a desired spatial locality metric for the circuit design, specifically to optimize a spatial distribution of such clusters. For example, the herein-described embodiments utilize trading propensity-based clustering to assign scan-enabled latches to individual scan chains in the scan architecture for a circuit design to optimize the wire lengths in the scan chains and thus minimize layout and timing issues.

Furthermore, trading propensity-based clustering may be used in the herein-described embodiments to enable circuit elements defined in a functional definition of a circuit design to be automatically connected with or assigned to overhead circuitry such as scan architecture circuitry after the functional definition of the circuit design has been created and the circuit elements in the design have been laid out into a floor plan to create a physical definition, thus allowing a logic designer to address functional issues in a circuit design without devoting as much attention to issues raised by the overhead circuitry during the development of the functional definition.

In addition, as described in more detail in the aforementioned cross-referenced application entitled "AUTOMATIC BACK ANNOTATION OF A FUNCTIONAL DEFINITION OF AN INTEGRATED CIRCUIT DESIGN BASED UPON PHYSICAL LAYOUT," the assignments of circuit elements to clusters, e.g., the assignment of latches to scan chains, may be utilized in a back annotation process to automatically back annotate the functional definition of the circuit design with the circuit element assignments generated via trading propensity-based clustering.

A functional definition within the context of the invention may be implemented, for example, using any number of hardware definition language (HDL) formats, e.g., VHDL, Verilog, etc., and represents all or a portion of the components and connectivity therebetween to implement the desired logic in an integrated circuit device, which may be independent of physical layout. A physical definition may be implemented, for example, as one or more netlist files, and represents the physical layout of all or a portion of the circuit design.

Circuit elements may alternately be referred to herein as cells or components, and it will be appreciated that a circuit element may incorporate circuitry with varied levels of complexity and abstraction, e.g., as small as a single logic gate or as large as a complex IP block containing hundreds or thousands of logic gates. Embodiments consistent with the invention effectively group some or all of the circuit elements in a circuit design into clusters or groups, and it will be appreciated that the principles of the invention may be applied to most if not all circuit elements for which it may be desirable to cluster for geographic-based reasons.

To implement trading propensity-based clustering consistent with the invention, circuit elements are initially grouped into size balanced clusters, i.e., clusters having exactly or approximately the same number of members. Desired centroids are defined for each cluster, representing a desired geographical location for each cluster in the layout of the circuit design. In the illustrated embodiment discussed below, the desired centroid for each cluster is defined as a point in a two dimensional space. In other embodiments, however, desired centroids may be established in a single dimension, or in three or more dimensions. Desired centroids may be defined manually or automatically, and in some implementations, it may be desirable to adjust or modify desired centroids to improve clustering.

Once a desired centroid is defined for each cluster, trading propensity-based clustering may be performed to selectively trade circuit elements singularly or in groups between clusters to improve the spatial distribution of the clusters, e.g., to make each cluster as spatially compact as possible.

The herein-described clustering algorithm is trading propensity-based to the extent that the algorithm selectively trades circuit elements assigned to different clusters based upon a trading propensity metric determined for some or all of the circuit elements in a circuit design. Trading propensity, within the context of the invention, is the relative degree to which trading, or moving, a particular circuit element from one cluster to another cluster would improve the spatial distributions of the clusters involved in the trade.

The trading propensity of a circuit element may be calculated, for example, based upon the distance from the circuit element to the desired centroid of both the cluster to which the circuit element is currently assigned and the cluster to which the circuit element may be assigned as a result of a trade. The distance to each desired centroid may be based, for example, upon the manhattan distance (sum of x and y distances), or alternatively, based upon the shortest distance between the two points (i.e., "as the crow flies"). The location of a circuit element may also vary, e.g., taken from an edge, an actual centroid of the circuit element, or where the assigned signal would connect to the circuit element.

Furthermore, in some embodiments, the trading propensity may also be based upon the number of components in a circuit element. For example, where assignments are made to overhead circuitry such as a scan architecture, whereby a circuit component may include multiple scan-enabled latches. By weighting the trading propensity by the number of latches, therefore, the comparatively greater effects of a larger component on the spatial distribution of a cluster may be accounted for.

Trading propensity-based clustering consistent with the invention optimizes the spatial distribution of one or more clusters by iteratively and repeatedly selecting pairs of clusters, determining a trading propensity metric for each circuit element grouped into each of such clusters, selecting one or more circuit elements from each of the clusters based upon the determined trading propensity metrics, and trading the selected circuit elements between the clusters.

Such iterative and repeated trades are typically performed until a desired endpoint is reached, e.g., after a preset number of iterations, after a preset number of iterations without a successful trade, etc.

The embodiments discussed hereinafter describe the assignment of scan-enabled latches to scan chains; however, it will be appreciated that the trading propensity-based clustering algorithm discussed herein may be used to assign scan-enabled latches as well as other types of circuit elements to different types of clusters, e.g., to facilitate the distribution of global signals such as functional signals or clock control signals to various circuit elements. In this regard, a global signal may be considered to incorporate any signal that is shared across multiple units or partitions of a circuit design using a distribution tree. A global signal assignment typically assigns a latch or other circuit element to a particular endpoint in the distribution tree that distributes a particular global signal.

Figure 1:
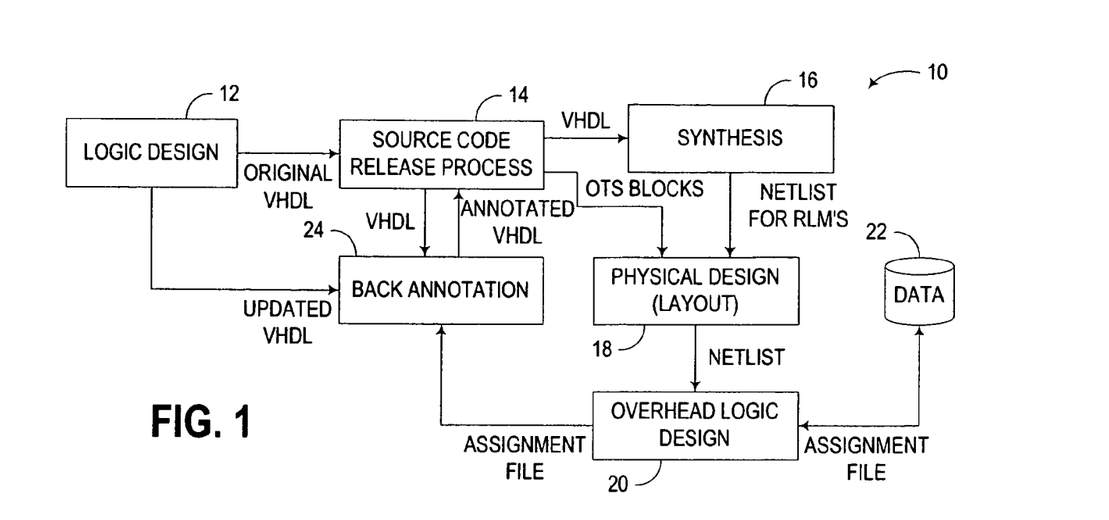
FIG. 1 is a block diagram of an integrated circuit design process incorporating trading propensity-based clustering consistent with the invention.

Turning now to the Drawings, wherein like numbers denote like parts throughout the several views, FIG. 1 illustrates an exemplary integrated circuit design process 10 suitable for implementing trading propensity-based clustering consistent with the invention. The design process typically begins with logic design, as shown in block 12, which is typically performed by one or more logic designers using logic design tools, and which results in the generation of a functional definition, e.g., in the form of one or more VHDL files. The VHDL files are typically, but not necessarily, provided to a source code release process 14, which maintains version control over the VHDL files.

From the VHDL files, one or more synthesis tools, e.g., various placement-based or timing-based synthesis tools, may be used to generate netlist files for Random Logic Macros (RLM's) from some or all of the VHDL files. These files are in turn used by one or more integrators in a physical design or layout process 18 to generate a floor plan for the circuit design. The floor plan may be represented, for example, using one or more netlist files, or using other manners of representing physical definitions of a circuit design. In addition to or in lieu of automated synthesis, some or all of the functional definition may be implemented using a custom or semi-custom design style using OTS blocks which may be maintained by source code release process 14, and which may be used by integrators during physical design 18 when generating a floor plan for the circuit design.

From the physical definition, represented in netlist format, an overhead logic design process 20 may be used to generate an assignment file including assignments between circuit elements and various signals associated with the overhead logic in the circuit design, e.g., related to the scan architecture. The assignment file may be stored in a database 22, and prior versions of the assignment file may be retrieved from database 22 in connection with generating the assignments in process 20. Process 20 may also be used to generate assignments for other global signals, e.g., functional signals distributed via distribution trees. It is within overhead logic design process 20 that trading propensity-based clustering is implemented in process 10 to assign scan-enabled latches to scan chains in the circuit design.

The assignment file generated by process 20 may then be used to back annotate the functional definition of the circuit design as shown in block 24. In particular, back annotation process 24 may be used to annotate the VHDL files generated by logic design process 12 with assignments defined in the assignment file. The annotated files are then provided to the source code release process 14 for retention. It will be appreciated that an assignment file may be implemented using any suitable data structure.

It will be appreciated that, using the process illustrated in FIG. 1, assignments made as a result of physical layout may be propagated back into the source VHDL generated by the logic design. Furthermore, modifications made to the physical layout at a later time may also be back annotated to the source VHDL. As also illustrated in FIG. 1, modifications to the functional definition of the circuit design, as shown by the arrow from block 12 to block 24, may also be used to annotate the functional definition of the circuit design. A more detailed discussion of back annotation is provided in the aforementioned cross-referenced application.

It will be appreciated that other design processes and methodologies may be utilized in different embodiments of the invention. Moreover, it will be appreciated that various operations within the process may be performed manually or in an automated fashion with the assistance of a computer-implemented tool. It will also be appreciated that back annotation may be performed using an assignment file generated in a manner other than that described herein in connection with overhead logic design process 20. Furthermore, manual back annotation may be used in some embodiments in addition to or in lieu of the automated process described herein. The invention is therefore not limited to the specific embodiments described herein.

Figure 2:
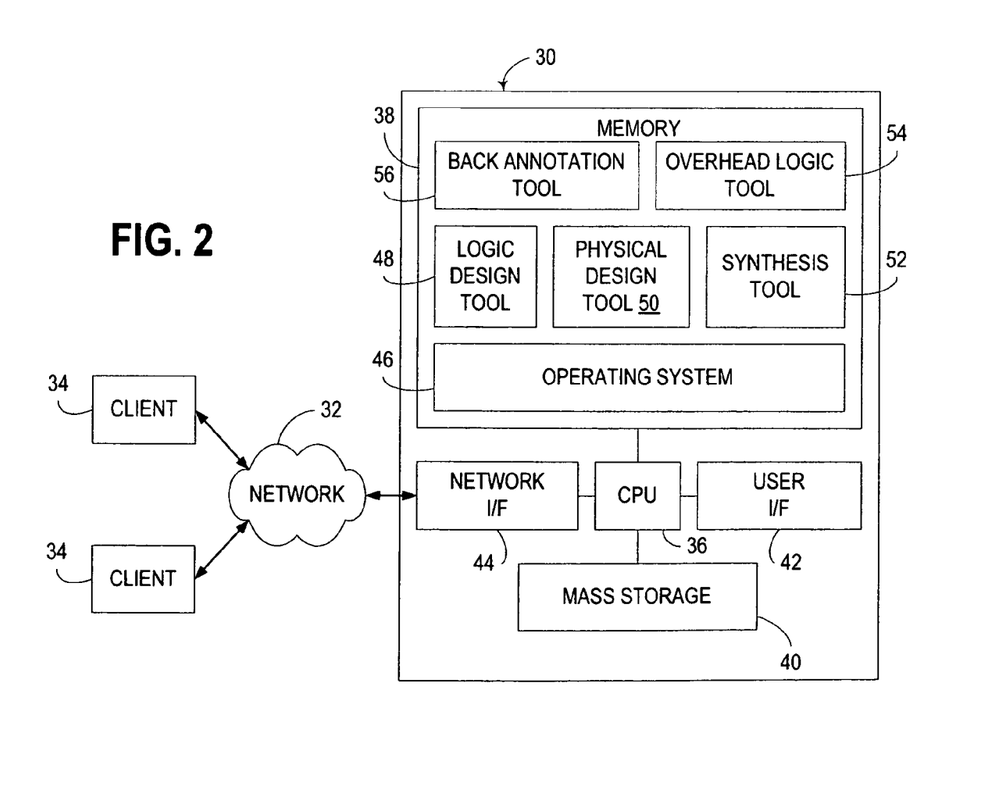
FIG. 2 is a block diagram of the principal hardware components in a computer system suitable for implementing the process of FIG. 1.

FIG. 2 next illustrates an apparatus 30 within which the various steps in process 10 may be performed. Apparatus 30 in the illustrated embodiment is implemented as a server or multi-user computer that is coupled via a network 32 to one or more client computers 34. For the purposes of the invention, each computer 30, 34 may represent practically any type of computer, computer system or other programmable electronic device. Moreover, each computer 30, 34 may be implemented using one or more networked computers, e.g., in a cluster or other distributed computing system. In the alternative, computer 30 may be implemented within a single computer or other programmable electronic device, e.g., a desktop computer, a laptop computer, a handheld computer, a cell phone, a set top box, etc.

Computer 30 typically includes a central processing unit 36 including at least one microprocessor coupled to a memory 38, which may represent the random access memory (RAM) devices comprising the main storage of computer 30, as well as any supplemental levels of memory, e.g., cache memories, non-volatile or backup memories (e.g., programmable or flash memories), read-only memories, etc. In addition, memory 38 may be considered to include memory storage physically located elsewhere in computer 30, e.g., any cache memory in a processor in CPU 36, as well as any storage capacity used as a virtual memory, e.g., as stored on a mass storage device 40 or on another computer coupled to computer 30. Computer 30 also typically receives a number of inputs and outputs for communicating information externally. For interface with a user or operator, computer 30 typically includes a user interface 42 incorporating one or more user input devices (e.g., a keyboard, a mouse, a trackball, a joystick, a touchpad, and/or a microphone, among others) and a display (e.g., a CRT monitor, an LCD display panel, and/or a speaker, among others). Otherwise, user input may be received via another computer or terminal.

For additional storage, computer 30 may also include one or more mass storage devices 40, e.g., a floppy or other removable disk drive, a hard disk drive, a direct access storage device (DASD), an optical drive (e.g., a CD drive, a DVD drive, etc.), and/or a tape drive, among others. Furthermore, computer 30 may include an interface 44 with one or more networks 32 (e.g., a LAN, a WAN, a wireless network, and/or the Internet, among others) to permit the communication of information with other computers and electronic devices. It should be appreciated that computer 30 typically includes suitable analog and/or digital interfaces between CPU 36 and each of components 38, 40, 42 and 44 as is well known in the art. Other hardware environments are contemplated within the context of the invention.

Computer 30 operates under the control of an operating system 46 and executes or otherwise relies upon various computer software applications, components, programs, objects, modules, data structures, etc., as will be described in greater detail below. Moreover, various applications, components, programs, objects, modules, etc. may also execute on one or more processors in another computer coupled to computer 30 via network 32, e.g., in a distributed or client-server computing environment, whereby the processing required to implement the functions of a computer program may be allocated to multiple computers over a network.

In general, the routines executed to implement the embodiments of the invention, whether implemented as part of an operating system or a specific application, component, program, object, module or sequence of instructions, or even a subset thereof, will be referred to herein as "computer program code," or simply "program code." Program code typically comprises one or more instructions that are resident at various times in various memory and storage devices in a computer, and that, when read and executed by one or more processors in a computer, cause that computer to perform the steps necessary to execute steps or elements embodying the various aspects of the invention. Moreover, while the invention has and hereinafter will be described in the context of fully functioning computers and computer systems, those skilled in the art will appreciate that the various embodiments of the invention are capable of being distributed as a program product in a variety of forms, and that the invention applies equally regardless of the particular type of computer readable media used to actually carry out the distribution. Examples of computer readable media include but are not limited to tangible, recordable type media such as volatile and non-volatile memory devices, floppy and other removable disks, hard disk drives, magnetic tape, optical disks (e.g., CD-ROMs, DVDs, etc.), among others, and transmission type media such as digital and analog communication links.

In addition, various program code described hereinafter may be identified based upon the application within which it is implemented in a specific embodiment of the invention. However, it should be appreciated that any particular program nomenclature that follows is used merely for convenience, and thus the invention should not be limited to use solely in any specific application identified and/or implied by such nomenclature. Furthermore, given the typically endless number of manners in which computer programs may be organized into routines, procedures, methods, modules, objects, and the like, as well as the various manners in which program functionality may be allocated among various software layers that are resident within a typical computer (e.g., operating systems, libraries, API's, applications, applets, etc.), it should be appreciated that the invention is not limited to the specific organization and allocation of program functionality described herein.

To implement the various activities in process 10 of FIG. 1, computer 30 includes a number of software tools, including, for example, a logic design tool 48, a physical design tool 50, and a synthesis tool 52, as well as a overhead logic tool 54 suitable for performing trading propensity-based clustering consistent with the invention, and a back annotation tool 56 for performing automated back annotation. Other tools utilized in connection with integrated circuit design, verification and/or testing may also be utilized in computer 30. Moreover, while tools 48-56 are shown in a single computer 30, it will be appreciated by one of ordinary skill in the art having the benefit of the instant disclosure that typically these tools will be disposed in separate computers, particularly where multiple individuals participate in the logic design, integration and verification of an integrated circuit design. Therefore, the invention is not limited to the single computer implementation that is illustrated in FIG. 2.

Those skilled in the art will recognize that the exemplary environment illustrated in FIGS. 1 and 2 is not intended to limit the present invention. Indeed, those skilled in the art will recognize that other alternative hardware and/or software environments may be used without departing from the scope of the invention.

Figure 3:
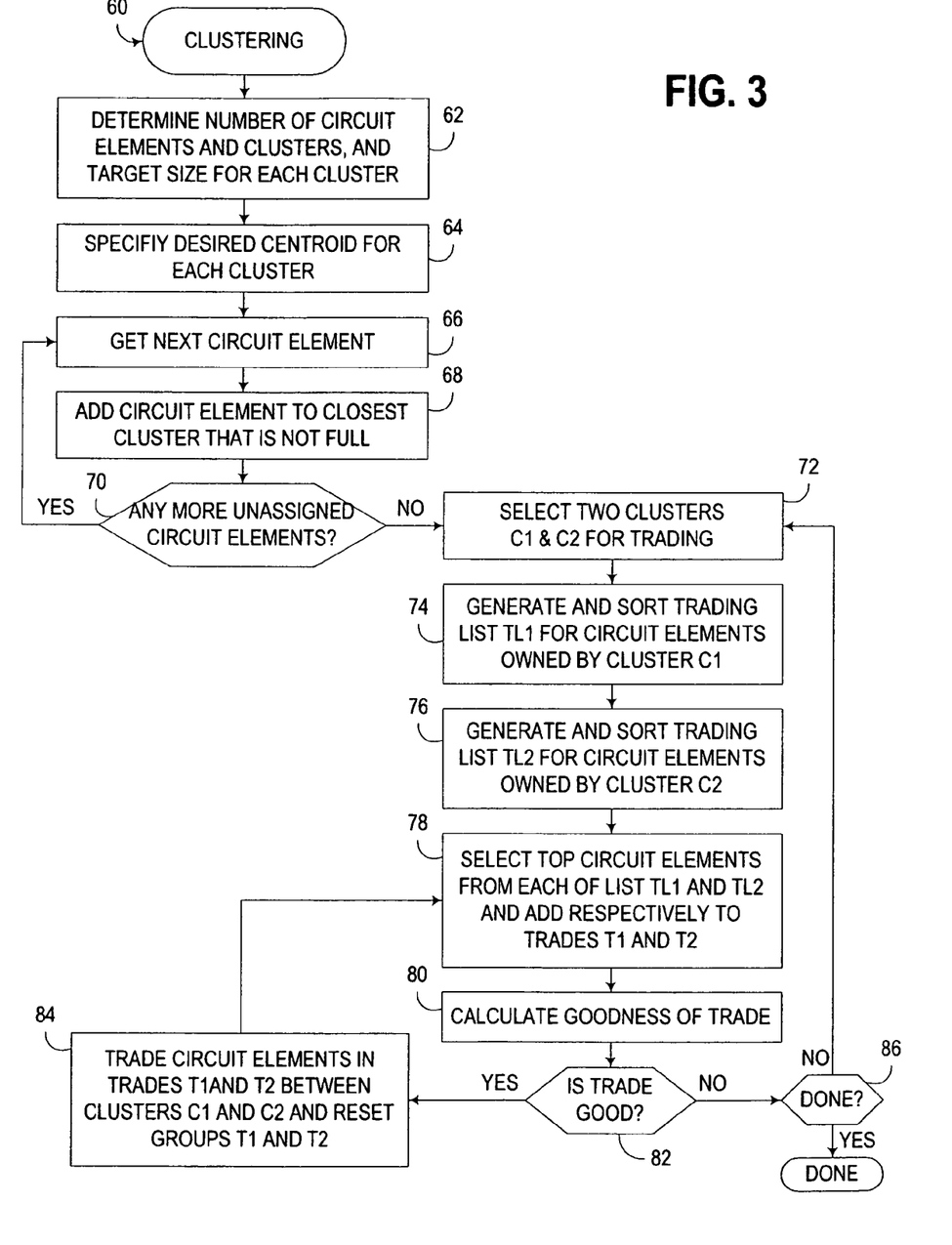
FIG. 3 is a flowchart illustrating the program flow of a clustering routine capable of being executed by the overhead logic tool referenced in FIG. 2.

Now turning to FIG. 3, an exemplary clustering routine 60, suitable for grouping circuit elements into clusters to optimize the spatial distribution thereof, is illustrated. Routine 60 begins in block 62 by initially determining the number of circuit elements and the desired number of clusters, as well as a target size for each cluster. Typically, the target size is based upon the ratio of the number of circuit elements to the number of clusters.

Next, a desired centroid for each cluster is specified in block 64. Typically, the exact actual location of desired centroid is not as important as the relative position of each cluster's desired centroid with respect to the desired centroids of the other clusters. The desired centroid may be specified manually, or alternatively may be determined programmatically.

Next, block 66 initiates a loop to initially assign circuit elements to each of the clusters. Specifically, block 66 obtains the next unassigned circuit element from among the circuit elements awaiting assignment to a scan chain by the trading propensity-based clustering algorithm. Next, block 68 adds the circuit element to the closest cluster (e.g., as determined via manhattan distance) that is not full (e.g., where the number of members is less than the target size plus some small delta to allow for granularity of circuit elements being grouped). Block 70 then determines whether any more circuit elements remain to be assigned to a cluster, and if so, returns control to block 66 to process additional circuit elements.

As an alternative to blocks 66-70, routine 60 may simply assign circuit elements to clusters randomly; however, in many instances, doing so will require more trades to be performed to optimize the clusters. Other algorithms may also be used to perform the initial assignment consistent with the invention.

Returning to block 70, once all circuit elements have been assigned, control passes to block 72 to initiate a loop that interatively selects and implements suitable trades between clusters. Each iteration of the loop is performed by selecting two of the clusters and then examining the potential trades between those clusters to see if any trades would result in a net benefit to the design.

Specifically, block 72 selects two clusters (designated C1 and C2) for trading. The clusters may be chosen by looping through the clusters and giving each cluster several opportunities to trade with each of the other clusters. The clusters may alternatively be chosen in a random fashion as long as each cluster gets multiple opportunities to trade with each other cluster. As another alternative, cluster selection may be based upon relative need, e.g., using a metric reflective of "cluster badness" so that more trading opportunities can be concentrated on those clusters having the least optimal spatial distributions. One possible measure of cluster badness is the sum of the distances between the centroid of the cluster and each of the circuit elements assigned to that cluster. As another alternative, the total area (e.g., the rectangular area) spanned by a cluster may be used as a measure of cluster badness.

Next, in blocks 74 and 76, trading lists TL1 and TL2 are generated for clusters C1 and C2. The trading lists include some or all of the circuit elements in the respective clusters, and are sorted by a trading propensity calculated for each circuit element in the respective clusters, thus identifying for each circuit element how strongly the cluster to which it is assigned would like to retain it or trade it away. In the illustrated embodiment, for example, the trading propensity for a circuit element may be based upon the distance of the circuit element to the cluster that it is currently assigned to and the distance to the cluster to which the circuit element may be traded.

For a circuit element in cluster C1, one suitable trading propensity (TP) metric may be calculated as follows:

$$TP = (D1-D2)(D1+D2)/SC$$

where D1 is the distance from the desired centroid of the current cluster to the circuit element, D2 is the distance from the desired centroid of the potential cluster to the circuit element, and SC is an optional scaling constant used to place the values into a desired range for implementation.

Note that if a circuit element belongs to cluster C1, and it is closer to C1's desired centroid than to C2's desired centroid, then D2 will be larger than D1 so the trading propensity will be negative, indicating that C1 does not want to trade this circuit element to cluster C2. As will be discussed below, this circuit element could still be traded if the trade has a net benefit to the design. Conversely, if a circuit element belongs to cluster C1, but is closer to cluster C2's desired centroid than to cluster C1's desired centroid, then D1 will be larger than D2 so the trading propensity will be positive, indicating that cluster C1 would like to trade this latch to cluster C2. As will be discussed below, this circuit element still may not be traded if the trade would not result in a net benefit to the design.

A number of different factors and formulas may be utilized to calculate a trading propensity for a circuit element consistent with the invention. For example, given a circuit element R1 that currently belongs to cluster C1, and which is being considered for a trade to cluster C2, it may be desirable to look at the closest circuit element to R1, e.g., circuit element R2, which may belong to C1, C2 or some other cluster, the trading propensity for R1 may be calculated as:

$$TP = (P)(SC)/(D)$$

where P is a polarity indicator that is set to +1 if R2 belongs to C2, or −1 if R2 does not belong to C2, D is the distance between R1 and R2, and SC is an optional scaling constant used to place the values into a desired range for implementation. In this regard, this implementation of a trading propensity metric increases the likelihood that a particular circuit element will be traded to another cluster if its closest neighbor also belongs to that cluster.

In addition, a trading propensity may be based upon factors such as net lengths, cluster bounding boxes, and even electrical characteristics such as passive loads. Trading propensity calculations may also utilize fuzzy logic principles in some embodiments. As such, the invention is not limited to the particular calculations described herein.

Once the trading propensities for the circuit elements in clusters C1 and C2 are calculated, trading lists TL1 and TL2 are sorted by trading propensity, so that the circuit elements that are the best candidates for trading are at the tops of the lists.

Next, block 78 selects one or more of the top circuit elements from each of lists TL1 and TL2 and adds these circuit elements to a pair of trades, or trade groups, T1 and T2, representing the circuit elements from clusters C1 and C2 to be traded between the clusters. Typically, the number of circuit elements selected from each cluster should be equal or approximately equal to maintain size balanced clusters after the trade. Then, after elements have been selected for trading, block 80 calculates the "goodness" of the potential trade, i.e., whether the trade will improve the spatial distribution of some or all of the clusters in the circuit design. If so, block 82 passes control to block 84 to perform the trade by assigning the circuit elements in T1 to cluster C2 and assigning the circuit elements in T2 to cluster C1. Block 84 also resets trades T1 and T2. Control then passes to block 78 to select more circuit elements off of lists TL1 and TL2 to attempt another trade between the clusters. In this regard, any circuit elements successfully traded between clusters are removed from trading lists TL1 and TL2 prior to selecting additional circuit elements off of the lists in block 78.

As an alternative, after circuit elements are traded in block 84, control may pass to block 86 or block 72, rather than attempting to perform additional trades with the same clusters. However, by attempting multiple trades between the same two clusters, the overhead associated with calculating trading propensities may be reduced.

Returning to block 80, the "goodness" of a proposed trade may be calculated in a number of manners consistent with the invention. For example, the goodness may be calculated by summing the trading propensity of all of the circuit elements in the proposed trade. The overall trading propensity, TPtotal, could be either positive or negative based on the trading propensities of the circuit elements in the proposed trade. If TPtotal is positive, then the proposed trade would have a positive net result for the clustering of the design even if individual circuit elements in the set did not want to be traded. Conversely, if TPtotal is negative, then the proposed trade would have a negative net result for the design clustering even if individual circuit elements had positive trading propensities. Consequently, the trading is "synergistic", resulting in individual circuit elements potentially being traded against their will if it improves the net results for the design. Other manners of calculating goodness, e.g., similar to those used to calculate cluster badness as described above, may be used in the alternative.

Returning to block 82, if it is determined that a trade is not good (e.g., if TPtotal is negative), control passes to block 86 to test an endpoint to determine whether the algorithm is complete. Potential trading between the currently selected clusters C1, C2 is complete for the time being, since if the current trade was not determined to be good, then other trades that would necessarily be based upon circuit elements lower down in lists TL1 and TL2 would not be good either.

Block 86 tests an endpoint, which if not met, returns control to block 72 to once again select two clusters for additional trading. Once the endpoint is reached, routine 60 is complete. The endpoint may be based upon a number of conditions, e.g., after all clusters have had a predetermined number of opportunities to trade with each of the other clusters, after no more beneficial trades are identified in any or all of the clusters, when the trading results are acceptable, after a predetermined number of iterations, after a predetermined number of iterations with no successful trades, etc.

Figure 4:
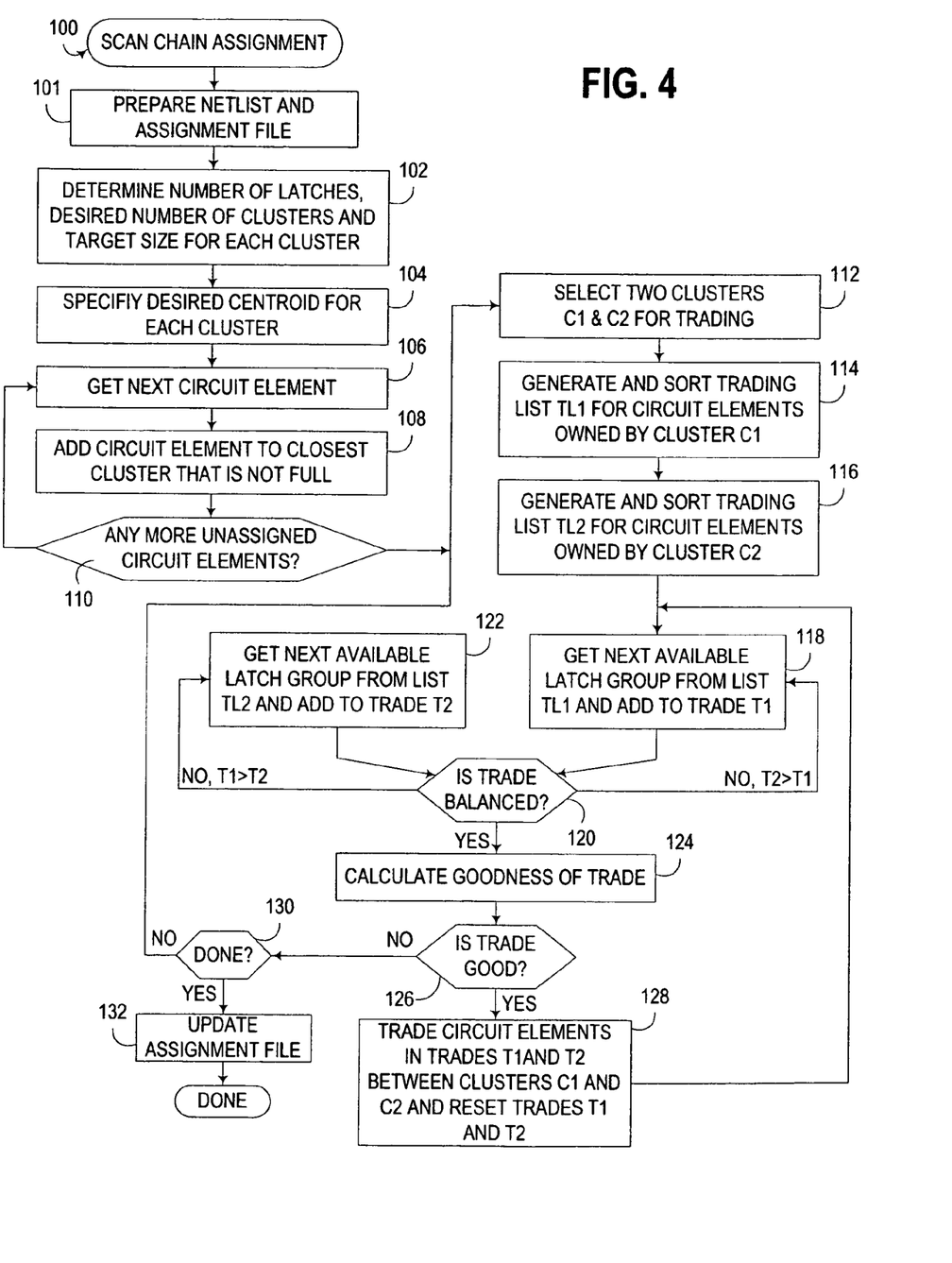
FIG. 4 is a flowchart illustrating the program flow of a scan chain assignment routine utilizing a trading propensity-based clustering algorithm capable of being executed by the overhead logic tool referenced in FIG. 2.

As noted above, the trading propensity-based clustering algorithm described herein may be utilized to cluster different types of circuit elements for different purposes. FIG. 4, for example, illustrates a scan chain assignment routine 100 that may be used to assign scan-enabled latches in a circuit design to different scan chains in the design. A typical chip design will have multiple scan chains to reduce scan chain length, and a scan architecture will typically assign each latch and register in the design to one and only one scan chain. It is desirable for the scan chains to be approximately the same size to reduce the time required to test the chip, and for the amount of wire required to connect the latches in a scan chain to be minimized by including in the scan chain latches that are located close together physically. As noted above, however, trading propensity-based clustering may be used for other purposes, e.g., whenever a large number of objects need to be divided into sets or clusters of approximately the same size with the desire to keep the clusters physically compact and non-overlapping.

Routine 100 begins in block 101 by preparing netlist and assignment files. Typically, this is performed by first loading into memory the netlist files based upon the most recent layout data for the circuit design. From this netlist data, the position, size and shape of each circuit element may be loaded into a map of the chip. Once all shapes have been loaded into memory, the elements that require connection to a scan chain may be flagged, such that the circuit elements in the design that do not require such connections may be removed from consideration. In this implementation, therefore, a circuit element is considered to include any circuit logic that implements one or more latches, e.g., registers and other blocks incorporating multiple latches.

The inclusion or exclusion of circuit elements may be rule based and may be defined in an assignment file that is also loaded in block 101. The assignment file may include a list of all of the circuit elements in a circuit design and the hierarchical name of each element. The assignment file also contains information about the scan chain and clock control trees to use for each circuit element (e.g., as input by a logic designer during development of the functional design). The assignment file may also contain information about the location of each scan chain in terms of a desired centroid.

Once the netlist and assignment file have been prepared, control passes to block 102 to perform a trading propensity-based clustering algorithm similar to that described above in connection with FIG. 3. Specifically, block 102 initially determines the number of latches and the desired number of clusters, as well as a target size for each cluster. Typically, the target size is based upon the ratio of the number of latches to the number of clusters. Given that a circuit element may have multiple latches in this embodiment, the target size is typically not calculated based upon the number of circuit elements in the design.

Next, a desired centroid for each cluster is specified in block 104, in a similar manner to block 64 of FIG. 3. Next, blocks 106, 108 and 110 initially assign circuit elements to each of the clusters in a similar manner to blocks 66-70 of FIG. 3. Block 108 may be implemented, in particular, by calculating the number of latches in each cluster, and incrementing appropriately as circuit elements are added to clusters (which may occur in groups, e.g., if circuit elements are added containing multiple latches). A cluster may be deemed full if the number of latches being assigned would make the total number assigned to that cluster too large. A cluster may be too large if the number of latches in that cluster is greater that the cluster target size (T, where T=L/C, L=total number of latches in the design, and C=number of clusters). In practical usage, latches may be grouped into circuit elements such as fixed-size registers, and due to this granularity, the cluster size may not be able to be exactly T for all clusters. As such, some small delta around T may be allowed.

Once all circuit elements have been assigned, block 110 passes control to block 112 to initiate a loop that interatively selects and implements suitable trades between clusters. Specifically, block 112 selects two clusters (designated C1 and C2) for trading, in a similar manner to block 72 of FIG. 3. In addition, in implementations where the selection is based upon "cluster badness", the cluster badness may be based upon a metric such as the total length of a scan chain that would be needed to connect all of the circuit elements in that cluster.

Next, in blocks 114 and 116, trading lists TL1 and TL2 are generated for clusters C1 and C2. The trading lists include some or all of the circuit elements in the respective clusters, and are sorted by a trading propensity calculated for each circuit element in the respective clusters, thus identifying for each circuit element how strongly the cluster to which it is assigned would like to retain it or trade it away.

As with blocks 74 and 76 of FIG. 3, the trading propensity for a circuit element may be calculated in blocks 114 and 116 based upon the distance of the circuit element to the cluster that it is currently assigned to and the distance to the cluster to which the circuit element may be traded. To account for multiple latches in a common circuit element, however, it may also be desirable to factor in the number of latches in a circuit element to calculate the trading propensity for that circuit element. For example, for a circuit element in cluster C1, one suitable trading propensity metric (TP) that accounts for the number of latches may be calculated as follows:

$$TP=(D1-D2)(D1+D2)(LC)/SC$$

where D1 is the distance from the desired centroid of the current cluster to the circuit element, D2 is the distance from the desired centroid of the potential cluster to the circuit element, LC is the latch count for the circuit element (i.e., the number of latches in a circuit element such as a register, and SC is an optional scaling constant used to place the values into a desired range for implementation. By incorporating the latch count in the calculation, circuit elements having multiple latches are effectively weighted more heavily in terms of defining the spatial distribution of a cluster.

Next, blocks 118-122 initiate a loop to build a balance trade including circuit elements listed in trades T1 and T2 and taken from lists TL1 and TL2. Specifically, block 118 is executed to select the next best available latch group (e.g., one or more circuit elements, each including one or more latches) from list TL1 for cluster C1, and add that latch group to trade T1. Control then passes to block 120 to determine whether the trade is balanced, i.e., whether the latch counts in trades T1 and T2 are equal, or alternatively, approximately equal within a threshold. If not, control either passes to block 122 (if the latch count in trade T1 is greater than in trade T2) or back to block 118 (if the latch count in trade T2 is greater than in trade T1). Block 122 operates in a similar manner to block 118, but selects the next best available latch group from list TL2 for cluster C2, and adds that latch group to trade T2. In this manner, latches are added, singularly or in groups, to each of trades T1 and T2 until the trade is determined to be balanced. Desirably, blocks 118-122 work together to create the smallest potential balanced trade between the clusters.

Next, once it is determined that the trade is balanced, block 120 passes control to block 124 to calculate the "goodness" of the potential trade, e.g., using any of the manners described above in connection with block 80 of FIG. 3. If the trade is determined to be good, block 126 passes control to block 128 to perform the trade by assigning the circuit elements/latches in T1 to cluster C2 and assigning the circuit elements/latches in T2 to cluster C1. Block 128 also resets trades T1 and T2. Control then passes to block 118 to select more latch groups off of lists TL1 and TL2 to attempt another trade between the clusters. In this regard, any latch groups successfully traded between clusters are removed from trading lists TL1 and TL2 prior to selecting additional circuit elements off of the lists in block 118.

Returning to block 126, if it is determined that a trade is not good, control passes to block 130 to test an endpoint to determine whether the algorithm is complete. If the endpoint is not met, control returns to block 112 to once again select two clusters for additional trading. Once the endpoint is reached, block 130 passes control to block 132 to update the assignment file and store the updated file. Routine 100 is then complete.

Figure 5:
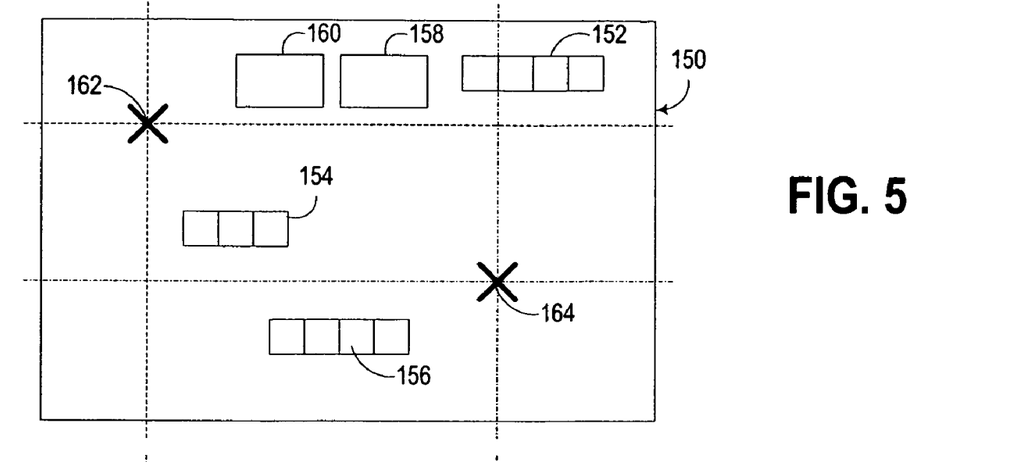
FIGS. 5-7 are block diagrams of an exemplary circuit design, illustrating the operation of the scan chain assignment routine referenced in FIG. 4.
Figure 6:
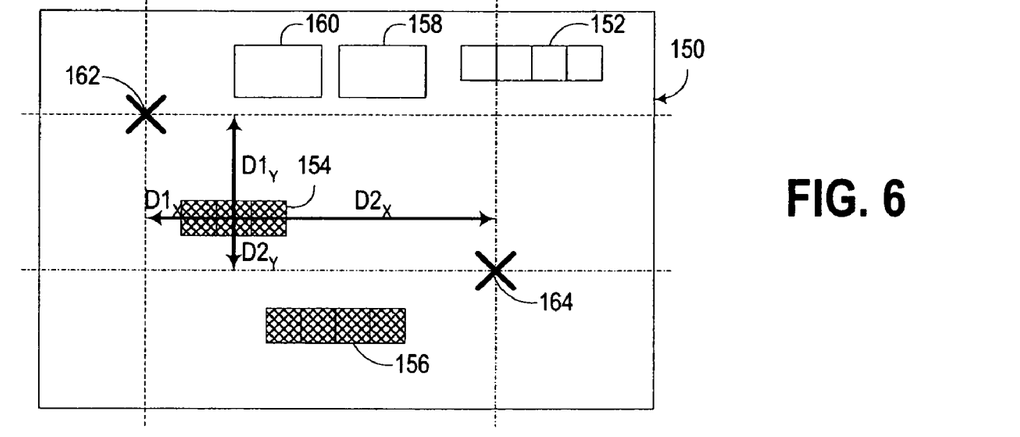
Figure 7:
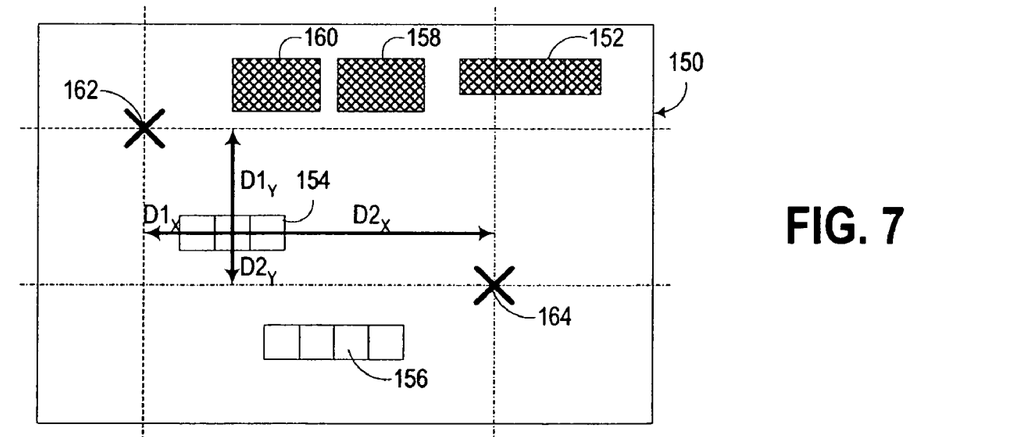

Now turning to FIGS. 5-7, an exemplary circuit design 150, incorporating a plurality of circuit elements that include single scan-enabled latches, is illustrated for the purposes of further describing the operation of the trading propensity-based clustering algorithms described herein, in particular that described above in connection with routine 100 of FIG. 4. FIG. 5, in particular, illustrates circuit elements 152, 154, 156, 158 and 160 that are distributed throughout circuit design 150, where circuit elements 158 and 160 have one latch, circuit elements 154 has three latches, and circuit elements 152 and 156 have four latches. In addition, the desired centroids of first and second clusters are illustrated at 162 and 164.

FIG. 6 next illustrates an exemplary initial assignment of circuit elements to the first and second clusters, with circuit elements 154 and 156 initially assigned to the first cluster having a desired centroid at 162, and circuit elements 152, 158 and 160 assigned to the second cluster having a desired centroid at 164.

FIG. 6 also shows the distances relevant to calculating the trading propensity for circuit element 154. Specifically, distances $D1_X$ and $D1_Y$ represent the horizontal and vertical distances to the first cluster, while distances $D2_X$ and $D2_Y$ represent the horizontal and vertical distances to the second cluster.

Assume for the purposes of the example that the trading propensities for the first cluster are sorted such that circuit elements 154 and 156 have the highest trading propensities amongst the elements in the first cluster, with circuit element 156 having the highest. Indeed, given that circuit element 154 is closer to centroid 162 than centroid 164, circuit element 154 likely has a negative trading propensity. Assume also that circuit elements 152, 158 and 160 have the highest trading propensities amongst the elements in the second cluster, with circuit element 160 having the highest, followed by circuit element 158 and then circuit element 152.

During generation of a trade using the algorithm described above in connection with blocks 118-122, circuit element 156 may be added first to trade T1, thus adding four latches to the trade. To balance the trade, block 122 would be executed three times to add (in sequence) circuit elements 160, 158 and 152 to trade T2, thus adding six latches to the trade. Block 118 would then be executed to add circuit element 154 to trade T1, thus bring the total number of latches in trade T1 to seven. Assume also that a delta of +/−1 is allowed to form a balanced trade, a balanced trade would be found upon addition of circuit element 154 to trade T1.

Upon generation of the trade, if the "goodness" of the trade is validated, e.g., where the sums of the trading propensities are positive, the trade will be accepted, and circuit elements 152, 158 and 160 will be assigned to the first cluster, with circuit elements 154 and 156 assigned to the second cluster. Consequently, despite the fact that the trading propensity for circuit element 154 indicated that the circuit element should not be traded, the trade is still performed due to the positive effect on the rest of the circuit elements in the design.

Various modifications may be made to the illustrated embodiments without departing from the spirit and scope of the invention. For example, rather than grouping trades into sets, trades may be performed solely between circuit elements or latch groups of the same size. To implement such a modification, block 122 of FIG. 4 may be modified to step through list TL2 to find the circuit element or latch group with the highest trading propensity and the same number of latches as in T1. In that event, the trade would be balanced by definition, so block 118 could proceed directly to block 122, and then to block 124, with block 120 omitted entirely. Furthermore, block 130 could be modified to return to block 118 so long as the list TL1 is not empty, and to block 112 if empty.

Various additional modifications to the herein-described embodiments will be apparent to one of ordinary skill in the art having the benefit of the instant disclosure. Therefore, the invention lies in the claims hereinafter appended.

What is claimed is:

1. A method of clustering circuit elements in a circuit design, the method comprising:
grouping a plurality of circuit elements in a circuit design into a plurality of size balanced clusters; and
optimizing a spatial distribution of the plurality of clusters by iteratively:
selecting first and second clusters;
determining a trading propensity metric for each circuit element grouped into each of the first and second clusters;
selecting a first selected circuit element from the first cluster and a second selected circuit element from the second cluster based upon the determined trading propensity metrics of at least a portion of the plurality of circuit elements; and
trading the first and second selected circuit elements between the first and second clusters.

2. The method of claim 1, wherein each of the plurality of circuit elements comprises a latch.

3. The method of claim 2, wherein each cluster is associated with a scan chain or a clock control tree.

4. The method of claim 1, selecting first and second clusters includes selecting the first and second clusters based upon a relative need of at least one cluster.

5. The method of claim 1, selecting first and second clusters includes selecting the first and second clusters during a plurality of iterations to enable each cluster among the plurality of clusters to attempt at least one trade with each other cluster among the plurality of clusters.

6. The method of claim 1, wherein grouping the plurality of circuit elements includes grouping the plurality of circuit elements into the plurality of size balanced clusters based upon the position of each circuit element in a layout for the circuit design.

7. The method of claim 1, wherein each cluster is associated with a desired centroid, and wherein the trading propensity metric for a circuit element is based at least in part upon a distance from such circuit element to the desired centroid of a cluster.

8. The method of claim 7, wherein the trading propensity metric for each circuit element grouped into the first cluster is based at least in part upon a first distance from such circuit element to the desired centroid of the first cluster and a second distance from such circuit element to the desired centroid of the second cluster.

9. The method of claim 8, wherein the trading propensity metric for each circuit element grouped into the first cluster is further based at least in part upon a number of latches in such circuit element.

10. The method of claim 7, wherein the trading propensity metric for each circuit element grouped into the first cluster is calculated using the formula:

$$TP=(D1-D2)(D1+D2)(LC)/SC,$$

where D1 is the distance from the desired centroid of the first cluster to such circuit element, D2 is the distance from the desired centroid of the second cluster to such circuit element, LC is a latch count for such circuit element, and SC is a scaling constant.

11. The method of claim 1, wherein optimizing the spatial distribution further comprises sorting circuit elements in each of the first and second clusters into respective first and second sorted lists based upon the trading propensity metrics, and wherein selecting the first and second circuit elements includes selecting the first and second circuit elements respectively from the first and second sorted lists.

12. The method of claim 11, wherein selecting the first and second circuit elements includes maintaining a size balance when selecting circuit elements from the first and second circuit elements such that the first and second clusters remain size balanced after trading the first and second circuit elements.

13. The method of claim 11, wherein optimizing the spatial distribution further includes, after trading the first and second circuit elements, removing the first and second elements from the first and second sorted lists, selecting third and fourth circuit elements respectively from the first and second sorted lists based upon their respective trading propensity metrics and trading the third and fourth circuit elements between the first and second clusters.

14. The method of claim 1, wherein optimizing the spatial distribution further includes determining whether trading the first and second circuit elements will improve the spatial distribution of at least one of the first and second clusters, and wherein trading the first and second circuit elements is performed based upon determining that trading the first and second circuit elements will improve the spatial distribution.

15. The method of claim 1, wherein the first circuit element includes at least one latch, wherein the second circuit element includes more than one latch, and wherein selecting the first and second circuit elements includes:

adding the first circuit element to a first trade group;

adding the second circuit element to a second trade group; and adding at least one additional circuit element to at least one of the first and second trade groups to maintain a balance between the number of latches in each of the first and second trade groups, wherein trading the first and second circuit elements includes assigning each circuit element in the first trade group to the second cluster and assigning each circuit element in the second trade group to the first cluster.

16. The method of claim 1, wherein selecting the first and second circuit elements includes selecting the second circuit element by identifying a circuit element in the second cluster having a same number of latches as the first circuit element.

* * * * *